(12) United States Patent
Gaillard et al.

(10) Patent No.: US 6,573,196 B1
(45) Date of Patent: Jun. 3, 2003

(54) METHOD OF DEPOSITING ORGANOSILICATE LAYERS

(75) Inventors: Frederick Gaillard, Voiron (FR); Li-Qun Xia, Santa Clara, CA (US); Tian-Hoe Lim, Santa Clara, CA (US); Ellie Yieh, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 135 days.

(21) Appl. No.: 09/638,803

(22) Filed: Aug. 12, 2000

(51) Int. Cl.[7] .............................................. H01L 21/469
(52) U.S. Cl. ...................... 438/789; 438/790; 438/793; 438/794
(58) Field of Search ................................ 438/789, 790, 438/793, 794

(56) References Cited

U.S. PATENT DOCUMENTS

| | | | |
|---|---|---|---|
| 4,634,601 A | 1/1987 | Hamakawa et al. | 427/39 |
| 4,894,352 A | 1/1990 | Lane et al. | 437/238 |
| 5,554,570 A * | 9/1996 | Maeda et al. | 438/763 |
| 5,989,998 A | 11/1999 | Sugahara et al. | 438/623 |
| 6,051,321 A | 4/2000 | Lee et al. | 428/447 |
| 6,054,379 A | 4/2000 | Yau et al. | 438/623 |
| 6,060,132 A | 5/2000 | Lee | 427/579 |
| 6,068,884 A | 5/2000 | Rose et al. | 427/255.6 |
| 6,242,339 B1 * | 6/2001 | Aoi | 438/623 |
| 6,344,693 B1 * | 2/2002 | Kawahara et al. | 257/759 |
| 6,352,945 B1 | 3/2002 | Matsuki et al. | 438/778 |
| 6,383,955 B1 | 5/2002 | Matsuki et al. | 438/790 |
| 6,410,463 B1 | 6/2002 | Matsuki | 438/790 |
| 6,432,846 B1 | 8/2002 | Matsuki | 438/790 |
| 6,436,824 B1 * | 8/2002 | Chooi et al. | 438/687 |
| 6,455,445 B2 | 9/2002 | Matsuki | 438/789 |
| 2002/0160626 A1 | 10/2002 | Matsuki et al. | 438/780 |

FOREIGN PATENT DOCUMENTS

WO    WO 99/41423    8/1999

* cited by examiner

*Primary Examiner*—Trung Dang
(74) *Attorney, Agent, or Firm*—Moser, Patterson & Sheridan

(57) ABSTRACT

A method of forming an organosilicate layer is disclosed. The organosilicate layer is formed by applying an electric field to a gas mixture comprising a phenyl-based silane compound. The gas mixture may optionally include an oxidizing gas. The organosilicate layer is compatible with integrated circuit fabrication processes. In one integrated circuit fabrication process, the organosilicate layer is used as an anti-reflective coating (ARC). In another integrated circuit fabrication process, the organosilicate layer is incorporated into a damascene structure.

55 Claims, 4 Drawing Sheets

METHOD OF DEPOSITING ORGANOSILICATE LAYERS

BACKGROUND OF THE DISCLOSURE

1. Field of the Invention

The present invention relates to organosilicate layers, their use in integrated circuit fabrication, and a method for forming an organosilicate layer.

2. Description of the Background Art

Integrated circuits have evolved into complex devices that can include millions of components (e. g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e. g., sub-micron dimensions), the materials used to fabricate such components contribute to their electrical performance. For example, low resistivity metal interconnects (e. g., copper and aluminum) provide conductive paths between the components on integrated circuits. Typically, the metal interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e. g., dielectric constants less than about 4.5) are needed.

The demands for greater integrated circuit densities also impose demands on the process sequences used for integrated circuit manufacture. For example, in process sequences using conventional lithographic techniques, a layer of energy sensitive resist is formed over a stack of material layers on a substrate. Many of these underlying material layers are reflective to ultraviolet light. Such reflections can distort the dimensions of features such as lines and vias that are formed in the energy sensitive resist material.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

Therefore, a need exists in the art for low dielectric constant materials suitable for integrated circuit fabrication. Particularly desirable would be a low dielectric constant material that is also an ARC.

SUMMARY OF THE INVENTION

A method for forming an organosilicate layer for use in integrated circuit fabrication is provided. In one embodiment, the organosilicate layer is formed by applying an electric field to a gas mixture comprising a phenyl-based silane compound. The gas mixture may optionally include an oxidizing gas.

The organosilicate layer is compatible with integrated circuit fabrication processes. In one integrated circuit fabrication process, the organosilicate layer is used as an antireflective coating (ARC) for DUV lithography. For such an embodiment, a preferred process sequence includes forming the organosilicate layer on a substrate. The organosilicate layer has a refractive index (n) in a range of about 1.20 to about 1.70 and an absorption coefficient (κ) in a range of about 0.1 to about 0.7 at wavelengths less than about 250 nm. The refractive index (n) and the absorption coefficient (κ) for the organosilicate layer are tunable, in that they can be varied in the desired range as a function of the deposition temperature as well as the gas composition used during layer formation. After the organosilicate layer is formed on the substrate, a layer of energy sensitive resist material is formed thereon. A pattern is defined in the energy sensitive resist at a wavelength less than about 250 nm. Thereafter, the pattern defined in the energy sensitive resist material is transferred into the organosilicate layer. After the organosilicate layer is patterned, such pattern is optionally transferred into the substrate using the organosilicate ARC layer as a hardmask.

In another integrated circuit fabrication process, the organosilicate layer is incorporated into a damascene structure. For such an embodiment, a preferred process sequence includes depositing a first dielectric layer on a substrate. An organosilicate layer is then formed on the first dielectric layer. Thereafter, the organosilicate layer is patterned and etched to define contacts/vias therethrough. After the organosilicate layer is patterned and etched, a second dielectric layer is deposited thereover. The second dielectric layer is then patterned and etched to define interconnects therethrough. The interconnects formed in the second dielectric layer are positioned over the contacts/vias formed in the organosilicate layer. After the interconnects are formed the contacts/vias defined in the organosilicate layer are etched through the first dielectric layer to the substrate surface. Thereafter, the damascene structure is completed by filling the interconnects and contacts/vias with a conductive material.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
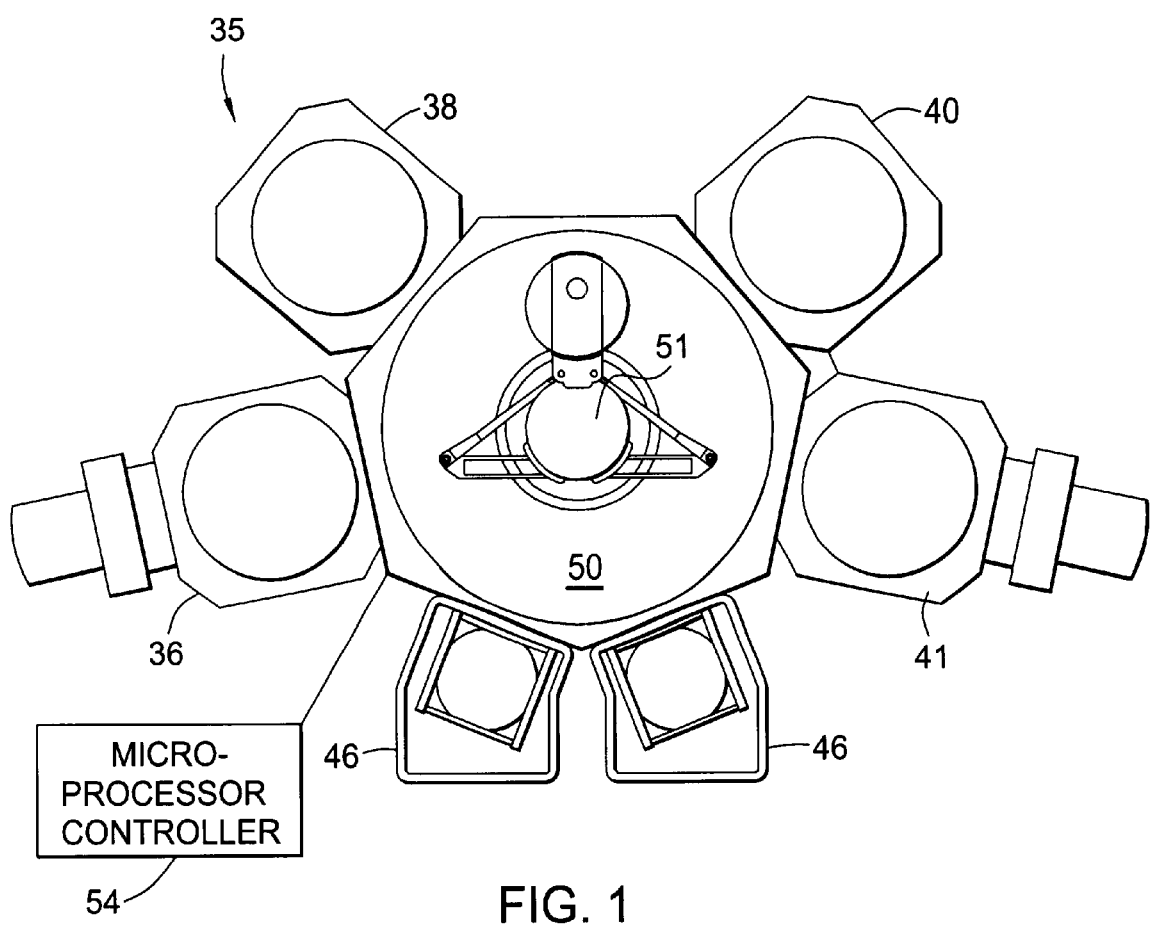
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described. This apparatus typically comprises process chambers 36, 38, 40, 41, load-lock chambers 46, a transfer chamber 50, a microprocessor controller 54, along with other hardware components such as power supplies (not shown) and vacuum pumps (not shown). An example of such a wafer processing system 35 is a CENTURA® System, commercially available from Applied Materials, Inc., Santa Clara, Calif.

Details of the wafer processing system 35 used in the present invention are described in commonly assigned U.S. Pat. No. 5,186,718, entitled, "Staged-Vacuum Substrate Processing System and Method", issued on Feb. 16, 1993, and is hereby incorporated by reference. The salient features of this system 35 are briefly described below.

The wafer processing system 35 includes a transfer chamber 50, containing a transfer robot 51. The transfer chamber 50 is coupled to load-lock chambers 46 as well as a cluster of process chambers 36, 38, 40, 41.

Substrates (not shown) are loaded into the wafer processing system 35 through load-lock chambers 46. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include physical vapor deposition (PVD) chambers, ionized metal plasma physical vapor deposition (IMP PVD) chambers, chemical vapor deposition (CVD) chambers, rapid thermal process (RTP) chambers, and anti-reflective coating (ARC) chambers, among others.

Figure 2:
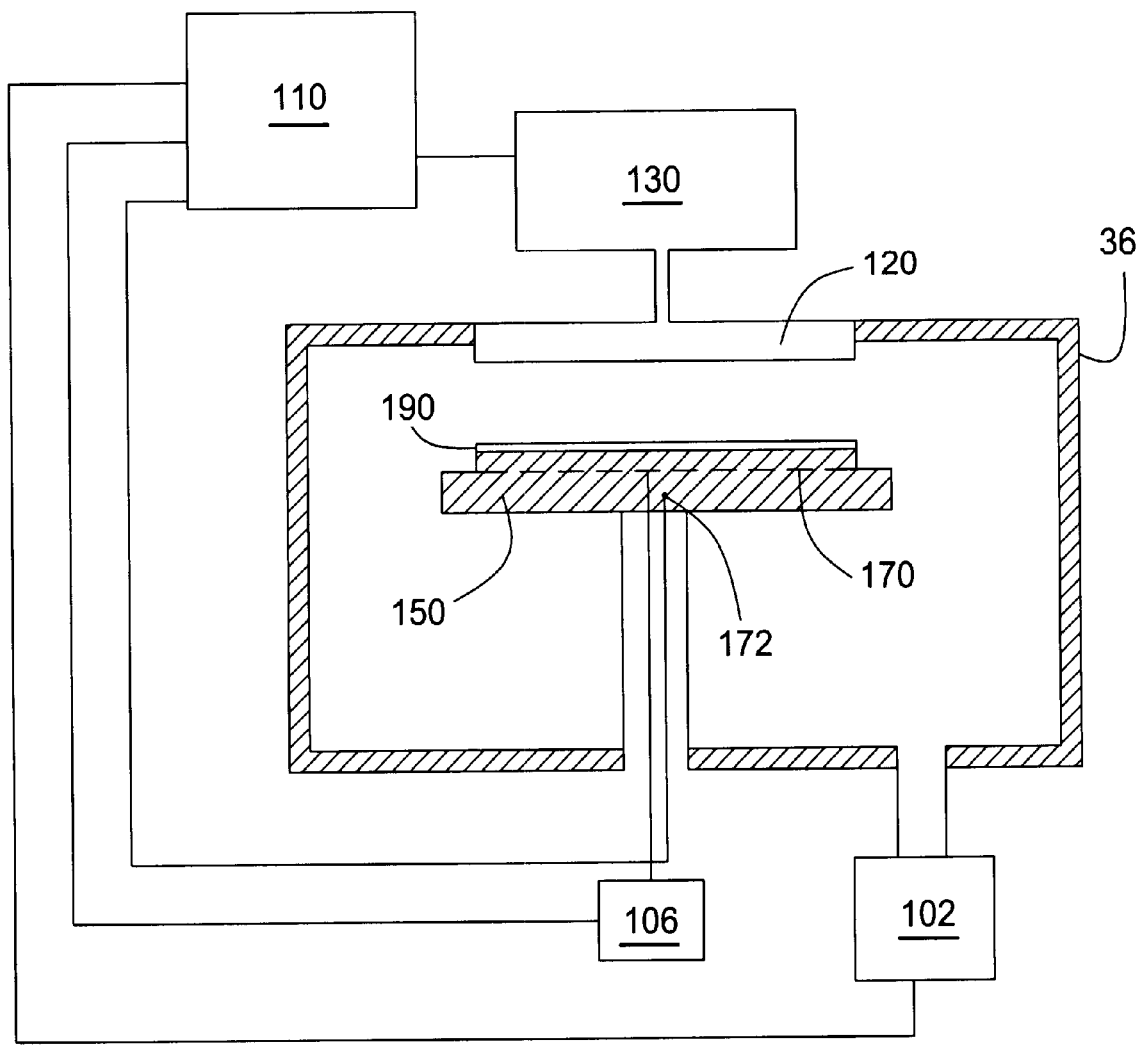
FIG. 2 depicts a schematic cross-sectional view of a chemical vapor deposition (CVD) chamber.

FIG. 2 depicts a schematic cross-sectional view of a chemical vapor deposition (CVD) process chamber 36 of wafer processing system 35. CVD process chamber 36 may be used to deposit organosilicate layers in accordance with embodiments described herein. An example of such a CVD process chamber 36 is a DXZ™ chamber, commercially available from Applied Materials, Inc., Santa Clara, Calif.

CVD process chamber 36 typically comprises a gas panel 130, a control unit 110, along with other hardware components such as power supplies and vacuum pumps. Details of the CVD process chamber 36 are described in commonly assigned U.S. patent application Ser. No. 09/211,998, entitled "High Temperature Chemical Vapor Deposition Chamber", filed on Dec. 14, 1998, and is herein incorporated by reference. The salient features of the CVD process chamber 36 are briefly described below.

The CVD process chamber 36 generally houses a support pedestal 150, which is used to support a substrate such as a semiconductor wafer 190. This pedestal 150 can typically be moved in a vertical direction inside the chamber 36 using a displacement mechanism (not shown). Depending on the specific process, the wafer 190 can be heated to some desired temperature prior to layer deposition. For example, the wafer support pedestal 150 is heated by an embedded heater element 170. The pedestal 150 may be resistively heated by applying an electric current from an AC supply 106 to the heater element 170. The wafer 190 is, in turn, heated by the pedestal 150. A temperature sensor 172, such as a thermocouple, is also embedded in the wafer support pedestal 150 to monitor the temperature of the pedestal 150 in a conventional manner. The measured temperature is used in a feedback loop to control the power supply 16 for the heating element 170, such that the wafer temperature can be maintained or controlled at a desired temperature which is suitable for the particular process application. The pedestal 150 is optionally heated using a plasma or by radiant heat (not shown).

A vacuum pump 102, is used to evacuate the process chamber 36 and to maintain the proper gas flows and pressure inside the chamber 36. A showerhead 120, through which process gases are introduced into the chamber 36, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 36 are ignited into a plasma. Typically, the electric field is generated by connecting the wafer support pedestal 150 to a source of RF power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

In at least one embodiment, organosilicate layer deposition is accomplished by plasma enhanced oxidation of a phenyl-based silane compound such as phenylmethyl silane. The phenyl-based silane compound is introduced into the process chamber 36 under the control of gas panel 130 as a gas with a regulated flow.

Proper control and regulation of the gas flows through the gas panel 130 is performed by mass flow controllers (not shown) and a computer (not shown). The showerhead 120 allows process gases from the gas panel 130 to be uniformly introduced and distributed in the process chamber 100.

Referring to FIG. 1, the CVD process chamber 36 is controlled by a microprocessor controller 54. The microprocessor controller 54 may be one of any form of general purpose computer processor (CPU) that can be used in an industrial setting for controlling various chambers and subprocessors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routine, when executed, transforms the general purpose computer into a specific process computer that controls the chamber operation so that a chamber process is performed. Alternatively, the process of the present invention may be performed in hardware, as an application specific integrated circuit or other type of hardware implementation, or a combination of software or hardware.

Organosilicate Layer Deposition

In one embodiment, the organosilicate layer is formed by applying an electric field to a gas mixture comprising a phenyl-based silane compound. The phenyl-based silane compound has the general formula $SiC_aO_bH_c$, where a has a range between 6 and 30, b has a range between 0 and 3, and c has a range between 9 and 30. For example, phenylmethyl silane ($SiC_7H_{10}$), phenylethyl silane ($SiC_8H_{12}$), phenylmethylethylsilane ($SiC_9H_{14}$), phenylmethoxy silane ($SiC_7OH_{10}$), phenylethoxy silane ($SiC_8OH_{12}$), phenylmethylethoxy silane ($SiC_9OH_{14}$), phenylmethoxyethoxysilane ($SiC_9O_2H_{13}$), among others may be used as the phenyl-based silane compound.

The gas mixture may optionally include an oxidizing gas. Oxygen ($O_2$), ozone ($O_3$), nitrous oxide ($N_2O$), carbon monoxide (CO), carbon dioxide ($CO_2$), nitrogen ($N_2$) or combinations thereof, among others, may be used as the oxidizing gas.

In general, the following deposition process parameters can be used to form the organosilicate layer using a CVD process chamber similar to that shown in FIG. 2. The process parameters range from a wafer temperature of about 100° C. to about 400° C., a chamber pressure of about 1 torr to about 10 torr, a phenyl-based silane compound gas flow rate of about 400 mgm to about 1000 mgm, an oxidizing gas flow rate of about 1 sccm to about 500 sccm, and an RF power of between about 50 watts to about 500 watts. The above process parameters provide a deposition rate for the organosilicate layer in the range of about 1000 Å/min to about 4000 Å/min when implemented on a 200 mm (millimeter) substrate in a deposition chamber available from Applied Materials, Inc.

Other deposition chambers are within the scope of the invention, and the parameters listed above may vary according to the particular deposition chamber used to form the organosilicate layer. For example, other deposition chambers may have a larger or smaller volume, requiring gas flow rates that are larger or smaller than those recited for deposition chambers available from Applied Materials, Inc. and may be configured to accommodate 300 mm substrates.

The as-deposited organosilicate layer has a dielectric constant that is less than about 3.0, making it suitable for use as an insulating material in integrated circuits. The dielectric constant of the organosilicate layer is tunable, in that it can be varied in a range between about 2.0 to about 3.0 as a function of the reaction temperature. In particular, as the temperature increases the dielectric constant of the asdeposited layer decreases.

The dielectric constant of the organosilicate layer can also be tuned as a function of the composition of the gas mixture during layer formation. As the carbon (C) concentration in the gas mixture increases, the C content of the as-deposited organosilicate layer increases, decreasing its dielectric constant.

The organosilicate layer also has an absorption coefficient that is tunable in a range of about 0.1 to about 0.7 at wavelengths less than about 250 nm. The absorption coefficient is tunable as a function of the reaction temperature. In particular, as the temperature increases the absorption coefficient of the as-deposited layer increases.

Integrated Circuit Fabrication Processes

A. Organosilicate Anti-Reflective Coating (ARC)

Figure 3A:
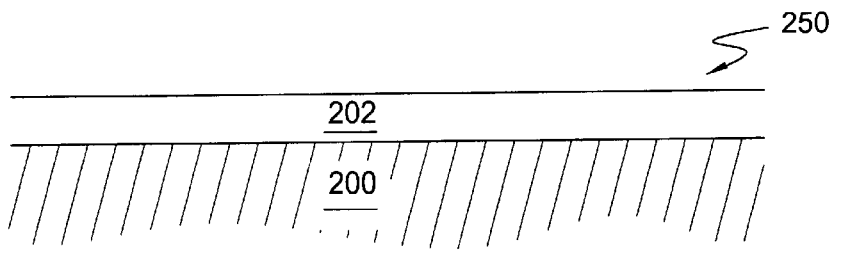
FIGS. 3a–3e depict schematic cross-sectional views of a substrate at different stages of integrated circuit fabrication incorporating an organosilicate layer as an anti-reflective coating (ARC)

FIGS. 3a–3e illustrate schematic cross-sectional views of a substrate 200 at different stages of an integrated circuit fabrication sequence incorporating an organosilicate layer as a hard mask. In general, the substrate 200 refers to any workpiece on which processing is performed, and a substrate structure 250 is used to generally denote the substrate together with other material layers formed on the substrate 200. Depending on the specific stage of processing, the substrate 200 may correspond to a silicon substrate, or other material layer that has been formed on the substrate. FIG. 3a, for example, illustrates a cross-sectional view of a substrate structure 250, having a material layer 202 that has been conventionally formed thereon. The material layer 202 may be an oxide (e. g., silicon dioxide). In general, the substrate 200 may include a layer of silicon, suicides, metals, or other materials. FIG. 3a illustrates one embodiment in which the substrate 200 is silicon having a silicon dioxide layer formed thereon.

Figure 3B:
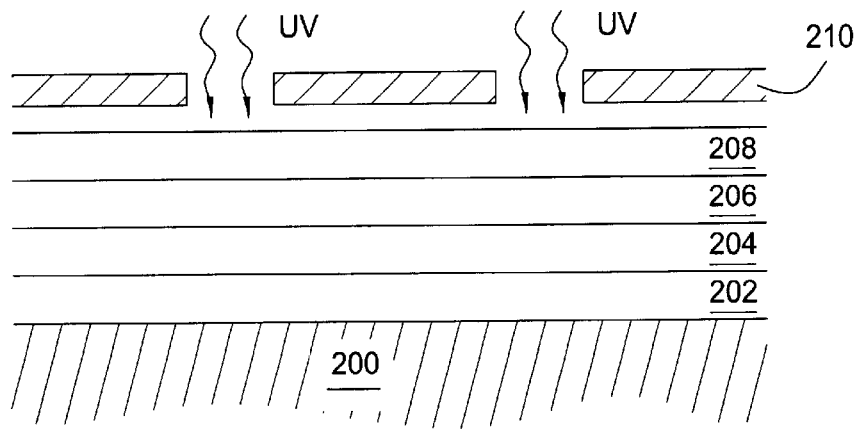

FIG. 3b depicts an organosilicate layer 204 formed on the substrate structure 250 of FIG. 3a. The organosilicate layer 204 is formed on the substrate structure 250 according to the process parameters described above. The thickness of the organosilicate layer is variable depending on the specific stage of processing. Typically, the organosilicate layer is deposited to a thickness of about 400 Å to about 700 Å.

A layer of energy sensitive resist material 208 is formed on the organosilicate layer 204. The layer of energy sensitive resist material 208 can be spin coated on the substrate to a thickness within a range of about 4,000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 245 nm.

Dependent on the etch chemistry of the energy sensitive resist material used in the fabrication sequence, an intermediate layer 206 is formed on the organosilicate layer 204 prior to the layer of energy sensitive resist material 208. When the energy sensitive resist material 208 and the organosilicate layer 204 can be etched using the same chemical etchants, the intermediate layer 206 functions as a mask for the organosilicate layer 204. The intermediate layer 206 is conventionally formed on the organosilicate layer 204. The intermediate layer 206 may be an oxide, nitride, silicon oxynitride, amorphous silicon, or other suitable material.

Figure 3C:
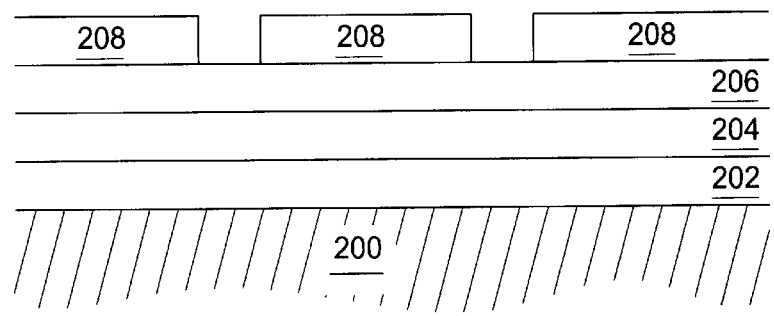

An image of a pattern is introduced into the layer of energy sensitive resist material 208 by exposing such energy sensitive resist material 208 to DUV radiation via mask 210. The image of the pattern introduced in the layer of energy sensitive resist material 208 is developed in an appropriate developer to define the pattern therethrough, as shown in FIG. 3c.

Figure 3D:
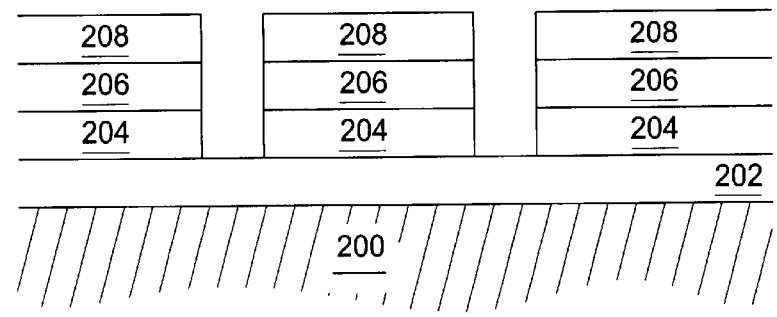

Referring to FIG. 3d, the pattern defined in the energy sensitive resist material 208 is transferred through the organosilicate layer 204. The pattern is transferred through the organosilicate layer 204 using the energy sensitive resist material 208 as a mask. The pattern is transferred through the organosilicate layer 204 using an appropriate chemical etchant. For example, fluorocarbon compounds such as fluoromethane ($CF_4$), fluoroethane ($C_2F_6$), and fluorobutene ($C_4F_8$) may be used to chemically etch the organosilicate layer 204.

Alternatively, when the intermediate layer 206 is present, the pattern defined in the energy sensitive resist material 208 is first transferred through the intermediate layer 206 using the energy sensitive resist material 208 as a mask. Thereafter, the pattern is transferred through the organosilicate layer 204 using the intermediate layer 206 as a mask. The pattern is transferred through both the intermediate layer 206 as well as the organosilicate layer 204 using appropriate chemical etchants.

Figure 3E:
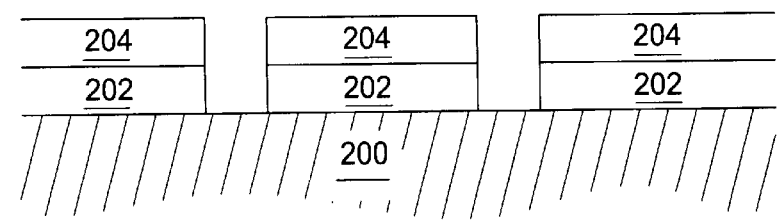

FIG. 3e illustrates the completion of the integrated circuit fabrication sequence by the transfer of the pattern defined in the organosilicate layer 204 through the silicon dioxide layer 202 using the organosilicate layer as a hardmask.

After the silicon dioxide layer 202 is patterned, the organosilicate layer 204 can optionally be stripped from the substrate 200 by etching it in a suitable chemical etchant.

B. Damascene Structure Incorporating an Organosilicate Layer

Figure 4A:
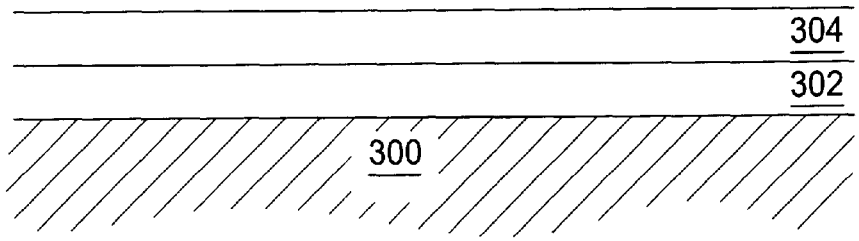
FIGS. 4a–4d depict schematic cross-sectional views of a damascene structure at different stages of integrated circuit fabrication incorporating an organosilicate layer in such structure.

FIGS. 4a–4d illustrate schematic cross-sectional views of a substrate 300 at different stages of a damascene structure fabrication sequence incorporating an organosilicate layer therein. Damascene structures are typically used to form metal interconnects on integrated circuits. Depending on the specific stage of processing, substrate 300 may correspond to a silicon substrate, or other material layer that has been formed on the substrate 300. FIG. 4a, for example, illustrates a cross-sectional view of a substrate 300 having a first dielectric layer 302 formed thereon. The first dielectric layer 302 may be an oxide (e. g., silicon dioxide, fluorosilicate glass). In general, the substrate 300 may include a layer of silicon, silicides, metals, or other materials.

FIG. 4a illustrates one embodiment in which the substrate 300 is silicon having a fluorosilicate glass layer formed thereon. The first dielectric layer 302 has a thickness of about 5,000 Å to about 10,000 Å, depending on the size of the structure to be fabricated.

An organosilicate layer 304 is formed on the first dielectric layer 302. The organosilicate layer 304 is formed on the first dielectric layer 302 according to the process parameters described above. The organosilicate layer 304 has a dielectric constant less than about 3.0, so as to prevent or minimize capacitive coupling between the metal interconnects to be formed in the damascene structure. The dielectric constant for the organosilicate layer is tunable, in that it can be varied in the desired range as a function of the reaction temperature as well as the composition of the gas mixture during layer formation.

The thickness of the organosilicate layer 304 is variable depending on the specific stage of processing. Typically, the organosilicate layer 304 has a thickness of about 200 Å to about 1000 Å.

Figure 4B:
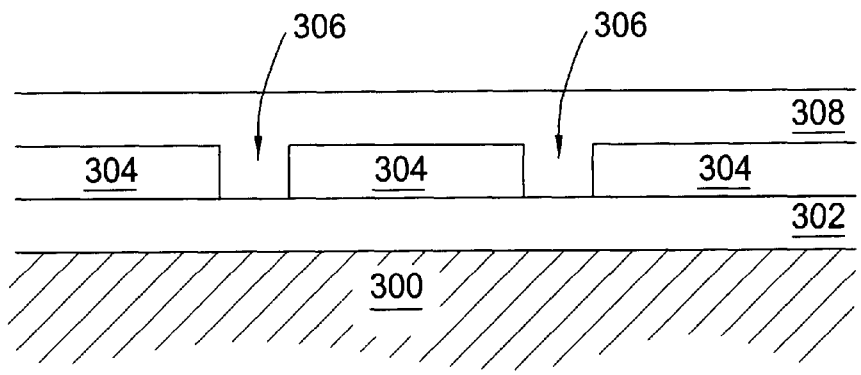

Referring to FIG. 4b, the organosilicate layer 304 is patterned and etched to define contact/via openings 306 and to expose the first dielectric layer 302, in areas where the contacts/vias are to be formed. The organosilicate layer 304 is patterned using conventional lithography and etched using fluorocarbon compounds such as fluoromethane ($CF_4$), fluoroethane ($C_2F_6$), and fluorobutene ($C_4F_8$).

After the organosilicate layer 304 is patterned, a second dielectric layer 308 is deposited over the organosilicate layer 304. The second dielectric layer 308 may be an oxide (e. g., silicon dioxide, fluorosilicate glass). The second dielectric layer 308 has a thickness of about 5,000 Å to about 10,000 Å.

Figure 4C:
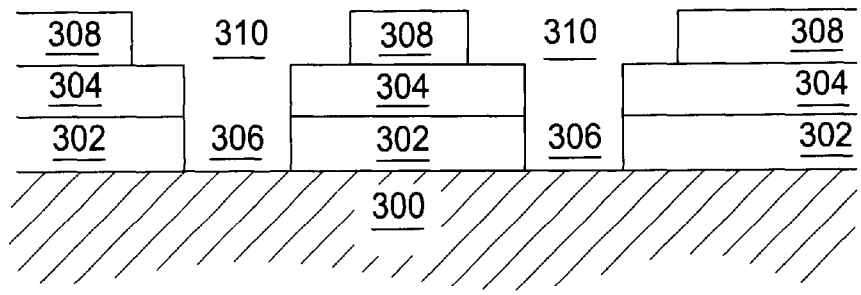

The second dielectric layer 308 is then patterned to define interconnect lines 310, as illustrated in FIG. 4c, preferably using conventional lithography processes. The interconnects 310 formed in the second dielectric layer 308 are positioned over the contact/via openings 306 in the organosilicate layer 304. Thereafter, both the interconnects 310 and contacts/vias 306 are etched using reactive ion etching or other anisotropic etching techniques.

Figure 4D:
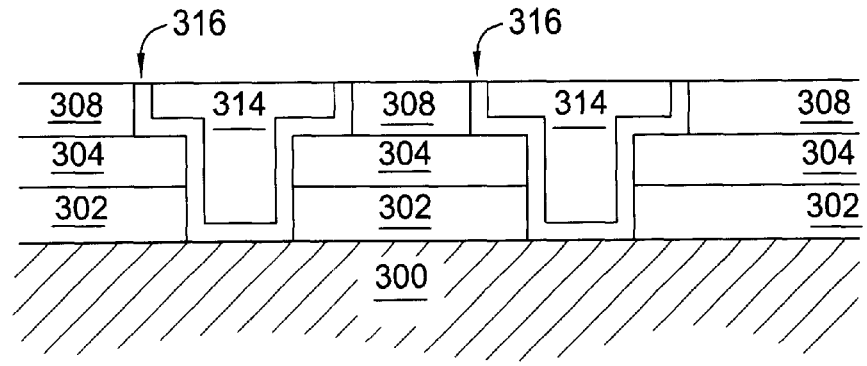

Referring to FIG. 4d, the interconnects 310 and contacts/vias 306 are filled with a conductive material 314 such as aluminum, copper, tungsten, or combinations thereof. Typically, copper is used to fill the interconnects 310 and contacts/vias 306 due to its low resistivity (resistivity about 1.7 $\mu\Omega$-cm). The conductive material 314 is deposited using chemical vapor deposition, physical vapor deposition, electroplating, or combinations thereof, to form the damascene structure. Preferably, a barrier layer 316 such as tantalum, tantalum nitride, or other suitable barrier material is first deposited conformably on the sidewalls of the interconnects 310 and contacts/vias 306 to prevent metal migration into the surrounding dielectric layers 302, 308 as well as the organosilicate layer 304.

Although several preferred embodiments, which incorporate the teachings of the present invention, have been shown and described in detail, those skilled in the art can readily devise many other varied embodiments that still incorporate these teachings.

What is claimed is:

1. A method of thin film deposition, comprising:
    positioning a substrate in a deposition chamber;
    providing a gas mixture to the deposition chamber, wherein the gas mixture comprises a phenyl-based silane compound comprising an alkyl group and a Si—H bond, and the phenyl-based silane compound is provided to the deposition chamber at a flow rate in a range of about 400 mgm to about 1000 mgm; and
    applying an electric field to the gas mixture in the deposition chamber to form an organosilicate layer on the substrate.

2. The method of claim 1 wherein the gas mixture further comprises an oxidizing gas.

3. A method of of thin film deposition, comprising:
    positioning a substrate in a deposition chamber;
    providing a gas mixture to the deposition chamber, wherein the gas mixture comprises a phenyl-based silane compound selected from the group of phenylmethoxy silane ($SiC_7OH_{10}$), phenylethoxy silane ($SiC_8OH_{12}$), phenylmethylethoxy silane ($SiC_9OH_{14}$), phenylmethoxyethoxysilane ($SiC_9O_2H_{13}$), and combinations thereof; and
    applying an electric field to the gas mixture in the deposition chamber to form an organosilicate layer on the substrate.

4. The method of claim 2 wherein the oxidizing gas is selected from the group of nitrous oxide ($N_2O$), oxygen ($O_2$), ozone ($O_3$), carbon monoxide (CO), carbon dioxide ($CO_2$), nitrogen ($N_2$) and combinations thereof.

5. The method of claim 1 wherein the electric field applied to the gas mixture in the deposition chamber is a radio frequency (RF) power.

6. The method of claim 5 wherein the RF power is within the range of about 50 watts to about 500 watts.

7. The method of claim 1 wherein the deposition chamber is maintained at a pressure between about 1 torr to about 10 torr.

8. The method of claim 2 wherein the oxidizing gas is provided to the deposition chamber at a flow rate in a range of about 1 sccm to about 500 sccm.

9. The method of claim 1 wherein the deposition chamber is maintained at a temperature between about 100° C. to about 400° C.

10. A method of forming an organosilicate layer on a substrate, comprising:
    positioning a substrate in a deposition chamber;
    providing a gas mixture to the deposition chamber, wherein the gas mixture comprises a phenyl-based silane compound comprising an alkyl group and a Si—H bond, and the phenyl-based silane compound is provided to the deposition chamber at a flow rate in a range of about 400 mgm to about 1000 mgm; and
    applying an electric field to the gas mixture in the deposition chamber to form an organosilicate layer on the substrate.

11. The method of claim 10 wherein the gas mixture further comprises an oxidizing gas.

12. A method of forming an organosilicate layer on a substrate, comprising:
    positioning a substrate in a deposition chamber;
    providing a gas mixture to the deposition chamber, wherein the gas mixture comprises a phenyl-based silane compound selected from the group of phenylmethoxy silane ($SiC_7OH_{10}$), phenylethoxy silane ($SiC_8OH_{12}$), phenylmethylethoxy silane ($SiC_9OH_{14}$), phenylmethoxyethoxysilane ($SiC_9O_2H_{13}$), and combinations thereof; and applying an electric field to the gas mixture in the deposition chamber to form an organosilicate layer on the substrate.

13. The method of claim 11 wherein the oxidizing gas is selected from the group of nitrous oxide ($N_2O$), oxygen ($O_2$), ozone ($O_3$), carbon monoxide (CO), carbon dioxide ($CO_2$), nitrogen ($N_2$) and combinations thereof.

14. The method of claim 10 wherein the electric field applied to the gas mixture in the deposition chamber is a radio frequency (RF) power.

15. The method of claim 14 wherein the RF power is within the range of about 50 watts to about 500 watts.

16. The method of claim 10 wherein the deposition chamber is maintained at a pressure between about 1 torr to about 10 torr.

17. The method of claim 11 wherein the oxidizing gas is provided to the deposition chamber at a flow rate in a range of about 1 sccm to about 500 sccm.

18. The method of claim 10 wherein the deposition chamber is maintained at a temperature between about 100° C. to about 400° C.

19. A method of forming a device, comprising:
   forming an organosilicate layer on a substrate, wherein the organosilicate layer is formed by applying an electric field to a gas mixture comprising a phenyl-based silane compound comprising an alkyl group and a Si—H bond;
   defining a pattern in at least one region of the organosilicate layer; and
   transferring the pattern defined in the at least one region of the organosilicate layer into the substrate using the organosilicate layer as a mask.

20. The method of claim 19 further comprising the step of removing the organosilicate layer from the substrate.

21. The method of claim 19 wherein the substrate has one or more material layers formed thereon.

22. The method of claim 19 wherein definition of the pattern in the at least one region of the organosilicate layer, comprises:
   forming a layer of energy sensitive resist material on the organosilicate layer;
   introducing an image of the pattern into the layer of energy sensitive resist material by exposing the energy sensitive resist material to patterned radiation;
   developing the image of the pattern introduced into the layer of energy sensitive resist material; and
   transferring the pattern through the organosilicate layer.

23. The method of claim 22 further comprising:
   forming an intermediate layer on the organosilicate layer prior to forming the layer of energy sensitive resist thereon, introducing the image of a pattern therein, and developing the pattern; and
   transferring the image of the pattern developed in the layer of energy sensitive resist material through the intermediate layer.

24. The method of claim 23 wherein the intermediate layer is an oxide.

25. The method of claim 24 wherein the oxide is selected from the group of silicon dioxide, fluorosilicate glass (FSG), and silicon oxynitride.

26. The method of claim 20 wherein the organosilicate layer is removed from the substrate using a fluorine-based compound.

27. The method of claim 26 wherein the fluorine-based compound is selected from the group of carbon tetrafluoride ($CF_4$), fluoromethane ($CF_4$), fluoroethane ($C_2F_6$), and fluorobutene ($C_4F_8$).

28. The method of claim 19 wherein the organosilicate layer is an anti-reflective coating at wavelengths less than about 250 nm (nanometers).

29. The method of claim 19 wherein the organosilicate layer has an absorption coefficient in a range of about 0.1 to about 0.7 at wavelengths less than about 250 nm.

30. The method of claim 29 wherein the absorption coefficient varies across the thickness of the organosilicate layer from about 0.1 to about 0.7.

31. The method of claim 19 wherein the organosilicate layer has an index of refraction in a range of about 1.2 to about 1.7.

32. The method of claim 19 wherein the gas mixture further comprises an oxidizing gas.

33. The method of claim 19 wherein the phenyl-based silane compound is selected from the group of phenylmethyl silane ($SiC_7H_{10}$), phenylethyl silane ($SiC_8H_{12}$), phenylmethylethylsilane ($SiC_9H_{14}$), phenylmethoxy silane ($SiC_7OH_{10}$), phenylethoxy silane ($SiC_8OH_{12}$), phenylmethylethoxy silane ($SiC_9OH_{14}$), phenylmethoxyethoxysilane ($SiC_9O_2H_{13}$), and combinations thereof.

34. The method of claim 32 wherein the oxidizing gas is selected from the group of nitrous oxide ($N_2O$), oxygen ($O_2$), ozone ($O_3$), carbon monoxide (CO), carbon dioxide ($CO_2$), nitrogen ($N_2$), and combinations thereof.

35. The method of claim 19 wherein the electric field applied to the gas mixture is a radio frequency (RF) power.

36. The method of claim 35 wherein the RF power is within the range of about 50 watts to about 500 watts.

37. The method of claim 19 wherein the organosilicate layer is formed in a deposition chamber maintained at a pressure between about 1 torr to about 10 torr.

38. The method of claim 19 wherein the phenyl-based silane compound is provided to the deposition chamber at a flow rate in a range of about 400 mgm to about 1000 mgm.

39. The method of claim 37 wherein an oxidizing gas is provided to the deposition chamber at a flow rate in a range of about 1 sccm to about 500 sccm.

40. The method of claim 37 wherein the deposition chamber is maintained at a temperature between about 100° C. to about 400° C.

41. A method of fabricating a damascene structure, comprising
   forming a first dielectric layer on a substrate;
   forming an organosilicate layer on the first dielectric layer, wherein the organosilicate layer is formed by applying an electric field to a gas mixture comprising a phenyl-based silane compound comprising an alkyl group and a Si—H bond;
   patterning the organosilicate layer to define contacts/vias therethrough;
   forming a second dielectric layer on the patterned organosilicate layer;
   patterning the second dielectric layer to define interconnects therethrough, wherein the interconnects are positioned over the contacts/vias defined in the organosilicate layer;
   etching the first dielectric layer to form contacts/vias therethrough; and filling the contacts/vias and the interconnects with a conductive material.

42. The method of claim 41 wherein the first dielectric layer and the second dielectric layer are each selected from the group consisting of amorphous carbon, fluorinated amorphous carbon, parylene, fluorinated silicate glass (FSG), $AF_4$, BCB, silicon carbide, oxynitride, and combinations thereof.

43. The method of claim 41 wherein the conductive material filling the contacts/vias and interconnects is selected from the group consisting of copper, aluminum, tungsten, and combinations thereof.

44. The method of claim 41 wherein the gas mixture further comprises an oxidizing gas.

45. The method of claim 41 wherein the phenyl-based silane compound is selected from the group of phenylmethyl silane ($SiC_7H_{10}$), phenylethyl silane ($SiC_8H_{12}$), phenylmethylethylsilane ($SiC_9H_{14}$), phenylmethoxy silane ($SiC_7OH_{10}$), phenylethoxy silane ($SiC_8OH_{12}$), phenylmethylethoxy silane ($SiC_9OH_{14}$), phenylmethoxyethoxysilane ($SiC_9O_2H_{13}$), and combinations thereof.

46. The method of claim 44 wherein the oxidizing gas is selected from the group consisting of nitrous oxide ($N_2O$), oxygen ($O_2$), ozone ($O_3$), carbon monoxide (CO), carbon dioxide ($CO_2$), nitrogen ($N_2$), and combinations thereof.

47. The method of claim 41 wherein the electric field applied to the gas mixture is a radio frequency (RF) power.

48. The method of claim 47 wherein the RF power is within the range of about 50 watts to about 500 watts.

49. The method of claim 44 wherein the phenyl-based silane compound is provided to a deposition chamber at a flow rate in a range of about 400 mgm to about 1000 mgm.

50. The method of claim 44 wherein the oxidizing gas is provided to the deposition chamber at a flow rate in a range of about 1 sccm to about 500 sccm.

51. The method of claim 49 wherein the deposition chamber is maintained at a pressure between about 1 torr to about 10 torr.

52. The method of claim 49 wherein the deposition chamber is maintained at a temperature between about 100° C. to about 400° C.

53. A method of forming a device, comprising:
    forming an organosilicate layer on a substrate, wherein the organosilicate layer is formed by applying an electric field to a gas mixture comprising a phenyl-based silane compound comprising an alkyl group and a Si—H bond, wherein the organosilicate layer is formed in a deposition chamber maintained at a pressure between about 1 torr to about 10 torr, and wherein the phenyl-based silane compound is provided to the deposition chamber at a flow rate in a range of about 400 mgm to about 1000 mgm; and
    defining a pattern in at least one region of the organosilicate layer.

54. The method of claim 53 wherein an oxidizing gas is provided to the deposition chamber at a flow rate in a range of about 1 sccm to about 500 sccm.

55. The method of claim 53 wherein the deposition chamber is maintained at a temperature between about 100° C. to about 400° C.

* * * * *

UNITED STATES PATENT AND TRADEMARK OFFICE
CERTIFICATE OF CORRECTION

PATENT NO.    : 6,573,196 B1
DATED         : June 3, 2003
INVENTOR(S)   : Gaillard et al.

It is certified that error appears in the above-identified patent and that said Letters Patent is hereby corrected as shown below:

<u>Column 5,</u>
Line 37, please change "asdepos-" to -- as-depos --.
Line 67, please change "suicides," to -- silicides --.

Signed and Sealed this

Thirtieth Day of September, 2003

JAMES E. ROGAN
*Director of the United States Patent and Trademark Office*